United States Patent
Van Veen et al.

(10) Patent No.: US 10,037,864 B2
(45) Date of Patent: Jul. 31, 2018

(54) HIGH VOLTAGE SHIELDING AND COOLING IN A CHARGED PARTICLE BEAM GENERATOR

(71) Applicant: MAPPER LITHOGRAPHY IP B.V., Delft (NL)

(72) Inventors: Alexander Hendrik Vincent Van Veen, Rotterdam (NL); Willem Henk Urbanus, Delft (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 0 days.

(21) Appl. No.: 15/594,712

(22) Filed: May 15, 2017

(65) Prior Publication Data

US 2017/0250053 A1    Aug. 31, 2017

Related U.S. Application Data

(63) Continuation of application No. 14/400,569, filed as application No. PCT/EP2013/059963 on May 14, 2013, now Pat. No. 9,653,261.

(Continued)

(51) Int. Cl.
     *G03B 27/52*      (2006.01)
     *H01J 37/09*      (2006.01)
     (Continued)

(52) U.S. Cl.
     CPC .............. *H01J 37/09* (2013.01); *B82Y 10/00* (2013.01); *B82Y 40/00* (2013.01); *H01J 37/147* (2013.01);
     (Continued)

(58) Field of Classification Search
     CPC .. H01J 37/09; H01J 37/3174; H01J 2237/002; H01J 2237/026;
     (Continued)

(56) References Cited

U.S. PATENT DOCUMENTS 3,924,136 A * 12/1975 Heynick ............. H01J 37/3007
                                                                                 250/398
4,142,133 A      2/1979 Genrikh et al.
(Continued)

FOREIGN PATENT DOCUMENTS

EP      1471561 A2    10/2004
EP      1498930 A1    1/2005
(Continued)

OTHER PUBLICATIONS

Adams et al. "Electrostatic cylinder lenses 2, 3 Element einzel lenses". Journal of Phisics Sci. Instruments 1972. vol. 5. pp. 150-155.
(Continued)

*Primary Examiner* — Deoram Persaud
(74) *Attorney, Agent, or Firm* — Hoyng Rock Monegier LLP; David P. Owen

(57) ABSTRACT

The invention relates to a charged particle beam generator. The generator may comprise a high voltage shielding arrangement (201) for shielding components outside the shielding arrangement from high voltages within the shielding arrangement, and a vacuum pump (220) located outside the shielding arrangement for regulating a pressure of a space within the shielding arrangement. The generator may comprise a collimator system with a cooling arrangement (405a/407a-407b/405b) comprising cooling channels inside electrodes of the collimator system.

37 Claims, 11 Drawing Sheets

Related U.S. Application Data

(60) Provisional application No. 61/646,839, filed on May 14, 2012.

(51) Int. Cl.
*H01J 37/30* (2006.01)
*H01J 37/317* (2006.01)
*B82Y 10/00* (2011.01)
*B82Y 40/00* (2011.01)
*H01J 37/147* (2006.01)
*H01J 37/302* (2006.01)

(52) U.S. Cl.
CPC ........ *H01J 37/302* (2013.01); *H01J 37/3007* (2013.01); *H01J 37/3174* (2013.01); *H01J 37/3177* (2013.01); *H01J 2237/002* (2013.01); *H01J 2237/026* (2013.01); *H01J 2237/0262* (2013.01); *H01J 2237/0264* (2013.01); *H01J 2237/16* (2013.01); *H01J 2237/182* (2013.01); *H01J 2237/188* (2013.01)

(58) Field of Classification Search
CPC ....... H01J 2237/0262; H01J 2237/0264; H01J 2237/16; H01J 2237/182; H01J 2237/188; H01J 37/147; H01J 37/3007; H01J 37/302; H01J 37/3177; B82Y 10/00; B82Y 40/00
See application file for complete search history.

(56) References Cited

U.S. PATENT DOCUMENTS

| | | |
|---|---|---|
| 4,551,599 A | 11/1985 | Liebl |
| 6,617,595 B1 | 9/2003 | Okunuki |
| 6,768,125 B2 | 7/2004 | Platzgummer et al. |
| 6,897,458 B2 | 5/2005 | Wieland et al. |
| 6,958,804 B2 | 10/2005 | Wieland et al. |
| 7,019,908 B2 | 3/2006 | van 't Spijker et al. |
| 7,084,414 B2 | 8/2006 | Wieland et al. |
| 7,129,502 B2 | 10/2006 | Kruit |
| 8,089,056 B2 | 1/2012 | Wieland et al. |
| 8,198,602 B2 | 6/2012 | Steenbrink et al. |
| 8,445,869 B2 | 5/2013 | Wieland et al. |
| 8,502,174 B2 | 8/2013 | Wieland |
| 8,502,176 B2 | 8/2013 | Wieland et al. |
| 8,586,949 B2 | 11/2013 | Gurtler et al. |
| 8,653,485 B2 | 2/2014 | Wieland et al. |
| 2001/0028044 A1 | 10/2001 | Hamaguchi et al. |
| 2002/0009901 A1 | 1/2002 | Maehara et al. |
| 2002/0063205 A1 | 5/2002 | Green |
| 2002/0096640 A1 | 7/2002 | Tanaka |
| 2002/0117967 A1 | 8/2002 | Gerlach et al. |
| 2003/0230986 A1 | 12/2003 | Horsky |
| 2004/0108458 A1 | 6/2004 | Gerlach |
| 2005/0072933 A1 | 4/2005 | Stengl et al. |
| 2005/0199820 A1 | 9/2005 | Eastham |
| 2007/0064213 A1 | 3/2007 | Jager et al. |
| 2007/0228275 A1 | 10/2007 | Fuse et al. |
| 2009/0001267 A1 | 1/2009 | Enyama |
| 2009/0093105 A1 | 4/2009 | Kobayashi |
| 2009/0146082 A1 | 6/2009 | Stengl et al. |
| 2009/0206271 A1 | 8/2009 | Eastham |
| 2009/0261267 A1 | 10/2009 | Wieland et al. |
| 2010/0065753 A1 | 3/2010 | Enyama |
| 2010/0195074 A1 | 8/2010 | Sogard |
| 2010/0201958 A1 | 8/2010 | Hauf |
| 2011/0042579 A1 | 2/2011 | De Boer et al. |
| 2011/0049393 A1 | 3/2011 | De Boer et al. |
| 2011/0084592 A1 | 4/2011 | Koning et al. |
| 2011/0317140 A1 | 12/2011 | Sigel |
| 2012/0085925 A1 | 4/2012 | Kasuya et al. |
| 2012/0145915 A1 | 6/2012 | Van Veen |
| 2012/0178025 A1 | 7/2012 | Tanaka |
| 2012/0293780 A1 | 11/2012 | Dinu-Gürtler et al. |
| 2012/0295203 A1 | 11/2012 | Sano |
| 2012/0318972 A1 | 12/2012 | Bream |
| 2013/0216959 A1 | 8/2013 | Tanaka |
| 2013/0256524 A1 | 10/2013 | Brown |
| 2014/0061497 A1 | 3/2014 | Gurtler et al. |
| 2014/0091229 A1 | 4/2014 | Nomura |
| 2014/0158903 A1 | 6/2014 | Sano |

FOREIGN PATENT DOCUMENTS

| | | |
|---|---|---|
| EP | 1983548 A1 | 10/2008 |
| JP | 07086350 | 3/1995 |
| JP | 2004 063547 A | 2/2004 |
| JP | 2004-214480 | 7/2004 |
| JP | 2005-127800 | 5/2005 |
| JP | 2005 294310 A | 10/2005 |
| JP | 2005 347582 A | 12/2005 |
| JP | 2006 140267 A | 6/2006 |
| JP | 2007-311621 | 11/2007 |
| JP | 2010 282799 A | 12/2010 |
| WO | WO2010 094801 | 8/2010 |
| WO | WO 2012 062932 A1 | 5/2012 |
| WO | WO 2012 062934 A1 | 5/2012 |
| WO | WO 2013 171216 A1 | 11/2013 |

OTHER PUBLICATIONS

Torres et al. "Experimental evaluation of an optimized radiation cooling geometry for ion projection lithography masks". J. Vac. Sci. Technol. Nov.-Dec. 2000. pp. 3207-3209.

Kim et al. "Optimisation of the temperature distribution across stencil mask membranes". J. Vac. Sci. Technol. Nov.-Dec. 1998. pp. 3602-3605.

Kaesmaier et al. "Ion projection lithography: International development program". J. Vac. Sci. Technol. Nov.-Dec. 1999. pp. 3091-3097.

* cited by examiner

HIGH VOLTAGE SHIELDING AND COOLING IN A CHARGED PARTICLE BEAM GENERATOR

This application is a continuation of U.S. application Ser. No. 14/400,569 filed on 12 Nov. 2014, which is a national stage entry of PCT/EP2013/059963 filed on 14 May 2013, which claims priority to U.S. provisional application No. 61/646,839 filed on 14 May 2012. All these applications are hereby incorporated by reference in their entirety.

BACKGROUND OF THE INVENTION

1. Field of the Invention

The present invention relates to a high voltage shielding arrangement and a cooling arrangement in a charged particle beam generator.

2. Description of the Related Art

In the semiconductor industry, an ever increasing desire exists to manufacture smaller structures with high accuracy and reliability. Lithography is a critical part of such manufacturing process. Currently, most commercial lithography systems use a light beam and mask as a means to reproduce pattern data for exposing a target, such as a wafer with a coating of resist thereon. In a maskless lithography system, charged particle beamlets may be used to transfer a pattern onto such target. The beamlets may be individually controllable to obtain the desired pattern.

However, for such charged particle lithography systems to be commercially viable, they need to handle a certain minimum throughput, i.e. the number of wafer being processed per hour should not be too far below the number of wafers per hour that are currently processed with an optical lithography system. Furthermore, the charged particle lithography systems need to meet low error margins. The combination of a relatively high throughput in combination with the requirement to meet low error margins is challenging.

A higher throughput may be obtained by using more beamlets, and therefore more current. However, handling a greater number of beamlets results in the need for more control circuitry. Furthermore, an increase in the current results in more charged particles that interact with components in the lithography system. Both the circuitry and the impingement of charged particles onto components may cause heating of the respective components within the lithography system. Such heating may reduce the accuracy of the patterning process within the lithography system. In a worst case scenario, such heating may stop one or more components within the lithography system from functioning.

Furthermore, the use of a great number of beamlets increases the risk of unacceptable inaccuracy due to interaction between the beamlets, e.g. Coulomb interactions. Such risk may be reduced by shortening the path between source and target. The shortening may be achieved by using stronger electric fields along the charged particle path, which may be the result of applying higher voltages to certain electrodes in the charged particle lithography system. The use of high voltage induces the risk that components within the lithography system are accidentally charged, which would be a risk for the reliability of the system.

Finally, an increase in the current that would be caused by increasing the number of beamlets in the lithography system would increase the demands with respect to the pressure in the electron optical column.

BRIEF SUMMARY OF THE INVENTION

It is an object of the invention to provide a charged particle beam generator having improved performance regarding pressure and high voltage management. For this purpose, the invention provides a charged particle beam generator, a charged particle lithography system, and a cooling arrangement of a collimator system of a charged particle beam generator, as described in this specification and defined in the claims.

It will be evident that the presently invented principle may be set into practice in various manners.

BRIEF DESCRIPTION OF THE DRAWINGS

Various aspects of the invention will be further explained with reference to embodiments shown in the drawings wherein.

DESCRIPTION OF ILLUSTRATIVE EMBODIMENTS

The following is a description of various embodiments of the invention, given by way of example only and with reference to the drawings.

Figure 1:
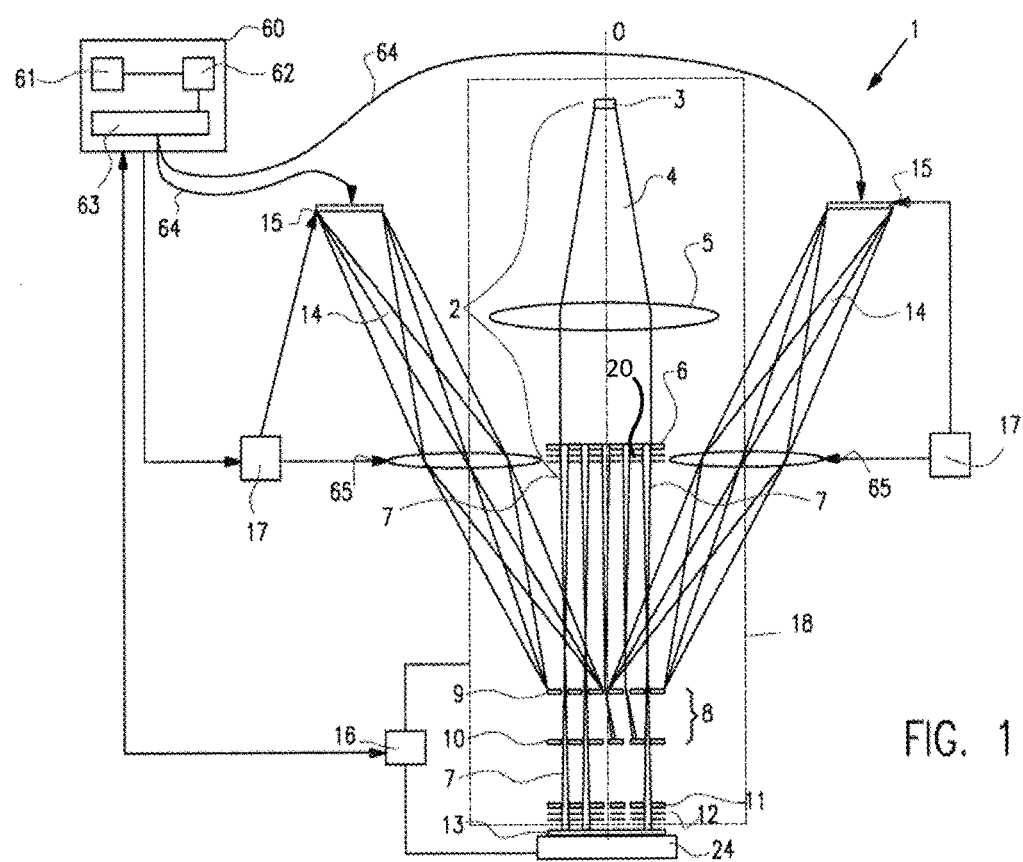
FIG. 1 is a simplified schematic drawing of an embodiment of a charged particle multi-beamlet lithography system.

FIG. 1 shows a simplified schematic drawing of an embodiment of a charged particle lithography apparatus 1. Such lithography systems are described for example in U.S. Pat. Nos. 6,897,458 and 6,958,804 and 7,019,908 and 7,084,414 and 7,129,502, U.S. patent application publication no.

2007/0064213, and co-pending U.S. patent application Ser. Nos. 61/031,573 and 61/031,594 and 61/045,243 and 61/055,839 and 61/058,596 and 61/101,682, which are all assigned to the owner of the present invention and are all hereby incorporated by reference in their entirety.

In the embodiment shown in FIG. 1, the lithography apparatus 1 comprises a beamlet generator 2 for generating a plurality of beamlets, a beamlet modulator 8 for patterning the beamlets to form modulated beamlets, and a beamlet projector for projecting the modulated beamlets onto a surface of a target 13. The beamlet generator 2 typically comprises a source 3 for producing a charged particle beam 4. In FIG. 1, the source 3 produces a substantially homogeneous, expanding charged particle beam 4. Hereafter, embodiments of the invention will be discussed with reference to an electron beam lithography system. Therefore, source 3 may be referred to as electron source 3 and beam 4 may be referred to as electron beam 4. It must be understood that a similar system as depicted in FIG. 1 may be used with a different type of radiation, for example by using an ion source for producing an ion beam.

In the embodiment shown in FIG. 1, the beamlet generator 2 further comprises a collimator lens 5 for collimating the electron beam 4 produced by the electron source 3, and an aperture array 6 for forming a plurality of beamlets 7. The collimator lens 5 may be any type of collimating optical system. Before collimation, the electron beam 4 may pass a double octopole (not shown). Preferably, the aperture array 6 comprises a plate provided with a plurality of through holes. The aperture array 6 blocks part of the electron beam 4, whereas a portion of the electron beam 4 passes the aperture array 6 through the holes so as to produce the plurality of electron beamlets 7. The system generates a large number of beamlets 122, preferably about 10,000 to 1,000,000 beamlets.

The beamlet modulator or modulation system 8 in the embodiment of FIG. 1 comprises a beamlet blanker array 9 and a beamlet stop array 10. The beamlet blanker array 9 comprises a plurality of blankers for deflecting one or more of the electron beamlets 7. The deflected and undeflected electron beamlets 7 arrive at beam stop array 10, which has a plurality of apertures. The beamlet blanker array 9 and beam stop array 10 operate together to block or let pass the beamlets 7. Generally, if beamlet blanker array 9 deflects a beamlet 7, it will not pass through the corresponding aperture in beam stop array 10, but instead will be blocked. However, if beamlet blanker array 9 does not deflect a beamlet 7, then it will pass through the corresponding aperture in beam stop array 10. Alternatively, beamlets 7 may pass the beamlet stop array 10 upon deflection by corresponding blankers in the beamlet blanker array 9 and be blocked by the beamlet stop array 10 if they are not deflected. To focus the beamlets 7 within the plane of the blanker array 9 the lithography system 1 may further comprise a condenser lens array 20.

The beamlet modulator 8 is arranged to provide a pattern to the beamlets 7 on the basis of pattern data input provided by a control unit 60. The control unit 60 comprises a data storage unit 61, a read out unit 62 and a data conversion unit 63. The control unit 60 may be located remotely from the rest of the system, for example outside the clean room. The pattern data may be transferred via optical fibers 64. The light transmitting ends of the optical fibers 64 may be assembled in one or more fiber arrays 15. The pattern data carrying light beams 14 are then projected onto corresponding light receiving elements, such as photodiodes, provided on the beamlet blanker array 9. Such projection may be done directly, or via projection system, in FIG. 1 schematically represented by projection lenses 65. One or more elements in such projections system, such as projection lenses 65, may be moveable under control of the control unit 60 via a positioning device 17 to enable proper alignment and/or focusing of the data carrying light beams 14 onto the corresponding light sensitive elements in the beamlet blanker array 9.

The light sensitive elements are coupled to one or more blankers and are arranged to convert the light signal into a different type of signal, for example an electric signal. A pattern data carrying light beam 14 may carry data for one or more blankers within the beamlet blanker array 9. The pattern data is thus sent via the pattern data carrying light beams towards the blankers to enable the blankers to modulate the charged particle beamlets 7 passing there through in accordance with a pattern.

The modulated beamlets coming out of the beamlet modulator 8 are projected onto a target surface of a target 13 by the beamlet projector. The beamlet projector comprises a beamlet deflector array 11 for scanning the modulated beamlets over the target surface and a projection lens arrangement 12 comprising one or more arrays of projection lenses for focusing the modulated beamlets onto the target surface. The target 13 is generally positioned on a moveable stage 24, which movement may be controlled by a control unit such as control unit 60.

For lithography applications, the target usually comprises a wafer provided with a charged-particle sensitive layer or resist layer. Portions of the resist film will be chemically modified by irradiation of the beamlets of charged particles, i.e. electrons. As a result thereof, the irradiated portion of the film will be more or less soluble in a developer, resulting in a resist pattern on a wafer. The resist pattern on the wafer can subsequently be transferred to an underlying layer, i.e. by implementation, etching and/or deposition steps as known in the art of semiconductor manufacturing. Evidently, if the irradiation is not uniform, the resist may not be developed in a uniform manner, leading to mistakes in the pattern. High-quality projection is therefore relevant to obtain a lithography system that provides a reproducible result.

The deflector array 11 and the projection lens arrangement 12 may be integrated into a single end module. Such end module is preferably constructed as an insertable, replaceable unit. The insertable, replaceable unit may also include the beamlet stop array 10.

The deflector array 11 may take the form of a scanning deflector array arranged to deflect each beamlet 7 that passes through the beamlet stop array 10. The deflector array 11 may comprise a plurality of electrostatic deflectors enabling the application of relatively small driving voltages. Although the deflector array 11 is drawn upstream of the projection lens arrangement 12, the deflector array 11 may also be positioned between the projection lens arrangement 12 and the target surface 13.

The projection lens arrangement 12 may thus be arranged to focus the beamlets 7 before or after deflection by the deflector array 11. Preferably, the focusing results a geometric spot size of about 10 to 30 nanometers in diameter. In such preferred embodiment, the projection lens arrangement 12 is preferably arranged to provide a demagnification of about 100 to 500 times, most preferably as large as possible, e.g. in the range 300 to 500 times. In this preferred embodiment, the projection lens arrangement 12 may be advantageously located close to the target surface 13.

The charged particle lithography apparatus 1 operates in a vacuum environment. A vacuum is desired to remove particles which may be ionized by the charged particle beams and become attracted to the source, may dissociate and be deposited onto the machine components, and may disperse the charged particle beams. A vacuum of at least $10^{-6}$ bar is typically required. Preferably, all of the major elements of the lithography apparatus 1 are housed in a common vacuum chamber, including the beamlet generator 2 including the charged particle source 3, the beamlet modulator 8, the beamlet projector system, and the moveable stage 24. These major elements are also referred to as the electron-optical column, or simply as the column, and is schematically represented by the dashed box 18 in FIG. 1.

In an embodiment the charged particle source environment is differentially pumped to a considerably higher vacuum of up to $10^{-10}$ mbar. In such embodiment, the source 3 may be located in a separate chamber, i.e. a source chamber. Pumping down the pressure level in the source chamber may be performed in the following way. First, the vacuum chamber and the source chamber are pumped down to the level of the vacuum chamber. Then the source chamber is additionally pumped to a desired lower pressure, preferably by means of a chemical getter in a manner known by a skilled person. By using a regenerative, chemical and so-called passive pump like a getter, the pressure level within the source chamber can be brought to a lower level than the pressure level in the vacuum chamber without the need of a vacuum turbo pump for this purpose. The use of a getter avoids the interior or immediate outside vicinity of the vacuum chamber being submitted to acoustical and/or mechanical vibrations as would be the case if a vacuum turbo pump or similar would be used for such a purpose.

Figure 2A:
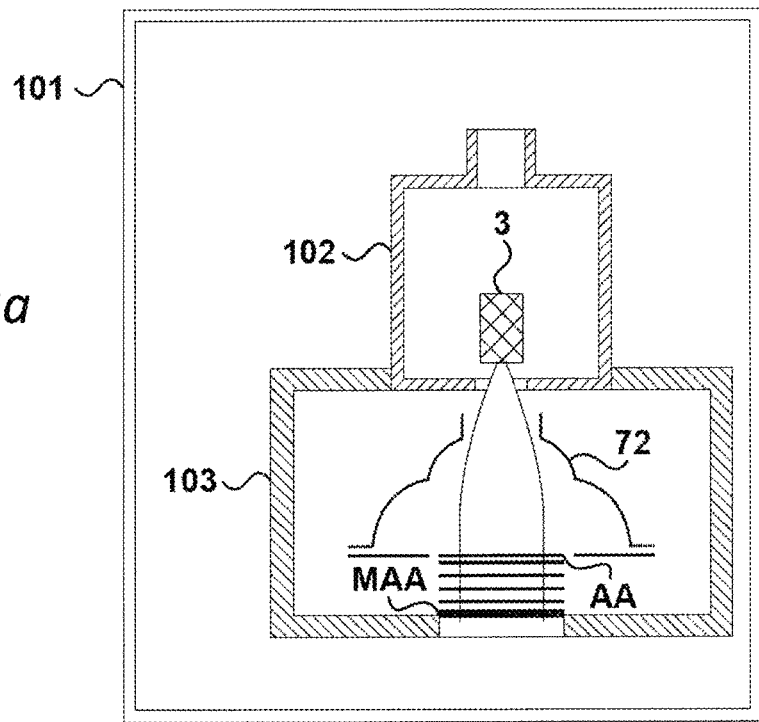
FIGS. 2A and 2B are simplified diagrams showing certain components of a projection column in a main vacuum chamber.
Figure 2B:
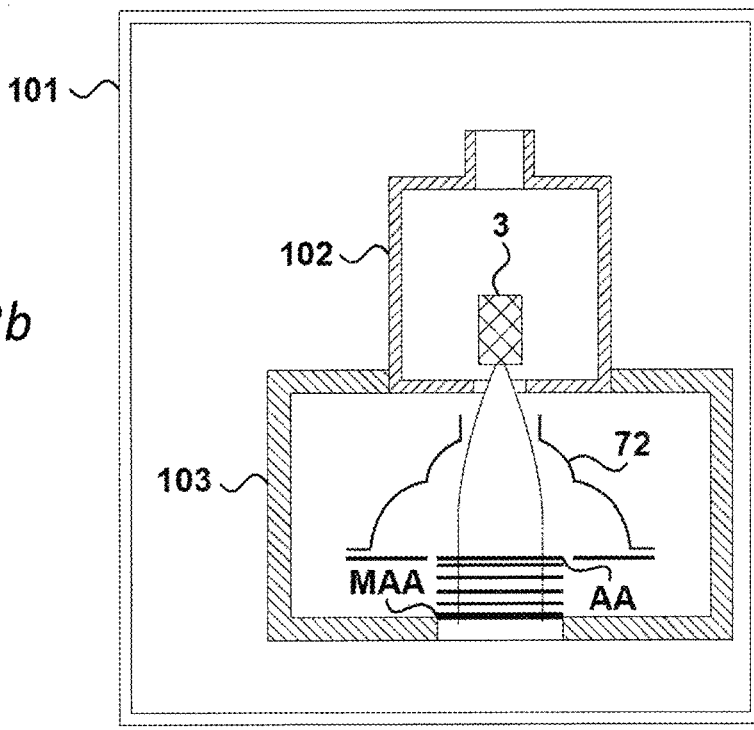

FIGS. 2A and 2B are simplified diagrams showing certain components of a projection column in a main vacuum chamber. FIG. 2A indicates a preferred operating vacuum pressure in the system with the main chamber at about $2 \times 10^{-6}$ mbar, the intermediate chamber at about $4 \times 10^{-9}$ mbar, and the source chamber at about $10^{-9}$ mbar. FIG. 2B shows a calculation of typical resulting partial pressure of hydrocarbon contaminants in the system, with hydrocarbon partial pressure in the main chamber of about $7 \times 10^{-8}$ mbar, in the intermediate chamber about $10^{-10}$ mbar, and in the source chamber about $10^{-11}$ mbar.

In the embodiment shown in FIGS. 2A and 2B the source 3 is located in a separate source chamber 102, and in this embodiment the collimator 72 and aperture array elements from the first aperture array element (AA) to the multi-aperture array (MAA) are located in an intermediate chamber 103. An alternative embodiment also includes the beamlet blanker array element in the intermediate chamber 103, so that the much smaller apertures of the blanker array element form the opening between the intermediate chamber and the main chamber. In another embodiment the first aperture array element (AA) forms the opening between the intermediate chamber and the main chamber, with the remaining aperture array elements located in the main chamber.

Figure 3:
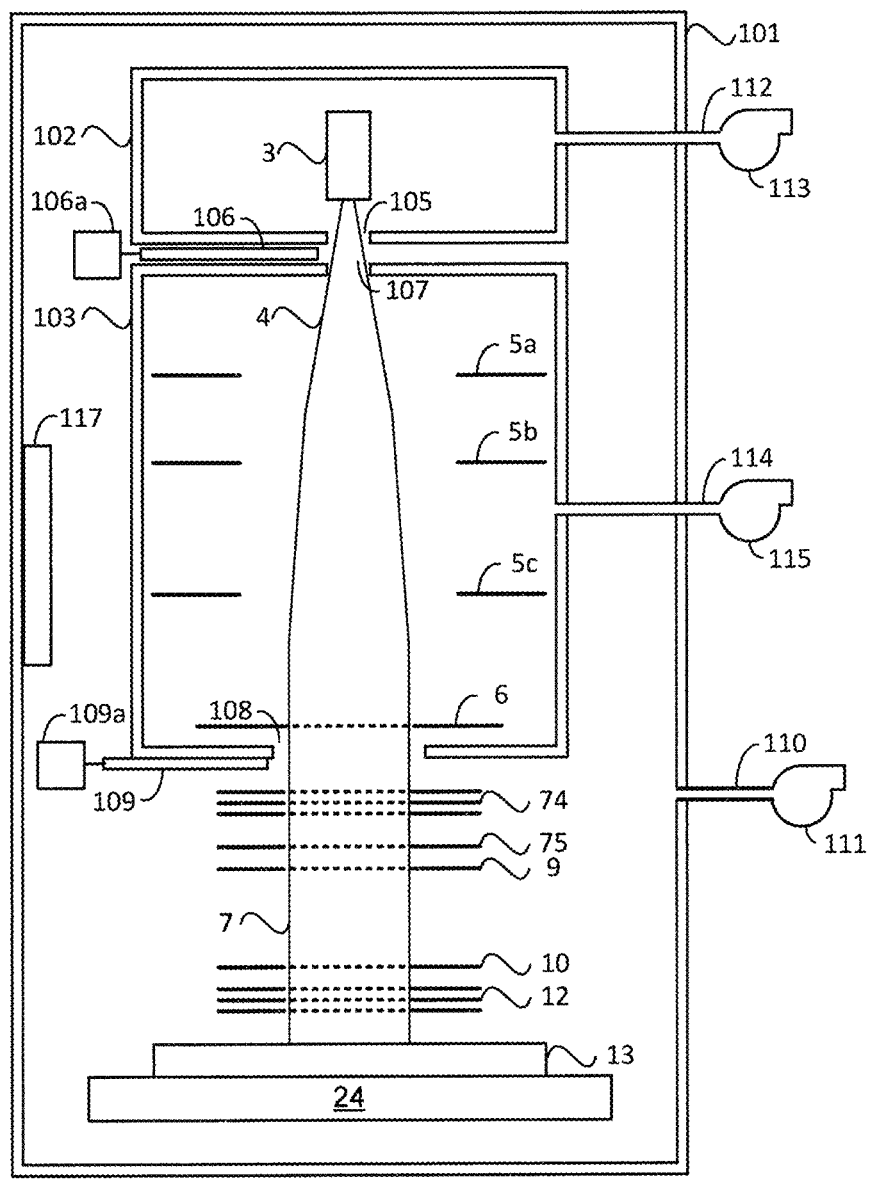
FIG. 3 illustrates another embodiment of a charged particle lithography system with an intermediate vacuum chamber.

FIG. 3 illustrates another embodiment of a charged particle lithography system with an intermediate vacuum chamber. The lithography system is enclosed in a main vacuum chamber 101. The lithography system operates in a vacuum environment. A vacuum is desired to remove particles which may be ionized by the charged particle beams and become attracted to the source, may dissociate and be deposited onto the lithography system's components, and may disperse the charged particle beams. A vacuum of about $2 \times 10^{-6}$ mbar is preferred. In order to maintain the vacuum environment, the charged particle lithography system is located in a main vacuum chamber 101. Note that FIG. 3 is a simplified diagram and many components of the lithography system are not shown that are normally located in the main vacuum chamber, e.g. the short stroke and long stroke wafer stages etc.

The charged particle source 3 is located in a source vacuum chamber 102 which is in turn located in the main vacuum chamber 101. This enables the environment in the source chamber 102 to be differentially pumped to a considerably higher vacuum than the main chamber 101, e.g. up to $10^{-10}$ mbar. Although only a single source 3 is shown in FIG. 3, the source chamber 102 may accommodate more than one source. The high vacuum within the source chamber 102 may promote the life time of the source 3, reduces the effects of gases in the source chamber interfering with the charged particle beam, and for some types of source may even be required for their functioning. The source is typically an electron source. A thermal dispenser type source may be used.

The high vacuum in the source chamber results in fewer free molecules circulating within the source chamber. Limiting free molecules in the source chamber limits contaminants from the main chamber such as water vapor and hydrocarbons outgassed from the resist-coated wafer being exposed can be limited, and reduces electron beam induced deposition (EBID) onto components in the source chamber.

The system of FIG. 3 also includes an intermediate chamber 103 located in the main chamber 101. In this embodiment, the intermediate chamber houses the collimating system 5 (which may be e.g. a single collimator electrode or one or more collimator lenses 5a, 5b, 5c as depicted in FIG. 3) and first aperture array element 6. Additional aperture array elements may be included in the intermediate chamber, such as in the embodiment shown in FIG. 2A.

The source and intermediate chambers may be constructed as a single vacuum chamber with a wall dividing the chamber into a top section for the source and bottom section comprising the intermediate chamber. Typical dimensions for the distance from the source 3 to the first aperture array 6 is about 300 mm.

The environment in the intermediate chamber 103 is differentially pumped to an intermediate pressure, between the vacuum level of the main chamber and the source chamber. For example, the system may be operated with the main chamber at about $2 \times 10^{-6}$ mbar, the intermediate chamber at about $4 \times 10^{-9}$ mbar, and the source chamber at about $10^{-9}$ mbar. Similarly to the source chamber, this high vacuum results in fewer free molecules circulating within the intermediate chamber, limiting contaminants from the main chamber such as water vapor and outgassed hydrocarbons, and reducing EBID on the components in the intermediate chamber.

The source chamber 102 is provided with an opening 105 in the wall of the source chamber 102 to permit transmission of the charged particle beam 4 into the intermediate chamber 103 and main chamber 101. The source chamber may be provided with a valve 106 for closing the opening 105 if needed, that is if the pressure level within the source chamber needs to be maintained at a much lower pressure level than the pressure level in the vacuum chamber. For example, the valve 106 may be closed if the vacuum chamber is opened, for example for servicing purposes. In such a case a high vacuum level is maintained within the source chamber, which may improve downtime of the lithography apparatus. Instead of waiting until the pressure level within the source chamber is sufficient, now only the vacuum chamber needs to be pumped down to a desired pressure level, which level is higher than the level needed in the source chamber. The valve 106 is controlled by an actuation unit 106a that may comprise a piezo-electric actuator, for example Physikinstrumente model N-214 or N-215 NEXLINE®.

The opening 105 in the source chamber 102 to permit transmission of the charged particle beam 4 needs to be relatively large to emit a large beam. The size of this opening amounts to a substantial fraction of the round beam needed for a 26 mm×26 mm lithography system column, and this large opening is too large to maintain the large pressure drop from the main chamber 101 to the source chamber 102, i.e. a pressure differential from $10^{-9}$ mbar in the source chamber to $2\times10^{-6}$ mbar in the main chamber. The intermediate vacuum chamber 103 creates an intermediate pressure environment which enables this large pressure differential to be maintained.

The intermediate chamber has an opening 107 corresponding to the source chamber opening 105, for admitting the charged particle beam, and an opening 108 between the intermediate chamber and the main chamber permitting transmission of the charged particle beamlets into the main chamber. A valve 109 may be provided for closing the opening 108 if needed, e.g. if the main vacuum chamber is opened for servicing purposes. A high vacuum level can be maintained within the intermediate (and source) chamber, which may improve downtime of the lithography apparatus by reducing pump down time because only the main vacuum chamber needs to be pumped down to the desired pressure level, which is higher than the level needed in the intermediate and source chambers. The valve 109 is controlled by an actuation unit 109a that may comprise a piezo-electric actuator.

The intermediate chamber 103 may be constructed so that the opening 108 between the intermediate chamber and the main chamber is formed by the first aperture array element. This can be achieved by forming a portion of the wall of the intermediate chamber to fit closely with the first aperture array element 6. For example, a recess may be formed in the intermediate chamber wall to accommodate the outer edge of the first aperture array. In this way, the size of the opening 108 is greatly reduced, the area of the opening comprising the plurality of very small apertures of the first aperture array. This greatly reduced size of the opening 108 permits a much larger differential pressure to be maintained between the intermediate chamber 102 and the main chamber 101.

The lithography system is preferably designed in a modular fashion to permit ease of maintenance. Major subsystems are preferably constructed in self-contained and removable modules, so that they can be removed from the lithography machine with as little disturbance to other subsystems as possible. This is particularly advantageous for a lithography machine enclosed in a vacuum chamber, where access to the machine is limited. Thus, a faulty subsystem can be removed and replaced quickly, without unnecessarily disconnecting or disturbing other systems. In the embodiment shown in FIG. 3, these modular subsystems may include a beam switching module including condenser lens arrays 74, multi-aperture array 75, beamlet blanker array 9, and a projection optics module including beam stop array 10 and projection lens arrays 12. The modules are designed to slide in and out from an alignment frame. Each module requires a large number of electrical signals and/or optical signals, and electrical power for its operation. The modules inside the vacuum chamber receive these signals from control systems which are typically located outside of the chamber. The vacuum chamber includes openings or ports for admitting cables carrying the signals from the control systems into the vacuum housing while maintaining a vacuum seal around the cables. Each module preferably has its collection of electrical, optical, and/or power cabling connections routed through one or more ports dedicated to that module. This enables the cables for a particular module to be disconnected, removed, and replaced without disturbing cables for any of the other modules.

The main vacuum chamber 101 is provided with an outlet and vacuum pumping system 111. The source chamber 102 may be provided with its own outlet 112 and pump 113, and intermediate chamber 103 may also be provided with an outlet 114 and pump 115. The pumps 113 and 115 are shown schematically exhausting externally of the main chamber. This may result in vibrations being fed through to the lithography system. Given the level of the vacuum in chambers 102 and 103, a chemical or getter pump may be used for catching molecules in these chambers without exhausting outside the main chamber. A cryogenic pump may also be used for these chambers, but may be precluded due to the small size of the chambers.

Pumping down the pressure level in the system may be performed in the following way. First, the main chamber 101 and intermediate chamber 103 and source chamber 102 are pumped down to the level of the main chamber 101. This may be accomplished completely or primarily by the pumping system 111 of the main vacuum chamber 101. The pumping system 111 may have one of more dedicated vacuum pumps for the main chamber, or one or more vacuum pumps may be shared between several main vacuum chambers for several separate lithography systems. Each main chamber may have a small vacuum pump, and share a larger vacuum pump. The ability to use more than one pump to realize a vacuum in the main vacuum chamber creates a vacuum pump redundancy that may improve the reliability of vacuum operation. If a vacuum pump malfunctions, another vacuum pump can take over its function.

The vacuum in the main vacuum chamber can be generated by turbo vacuum pumps, and a cryopump system may also be used. A water vapor cryopump, for example in the form of one or more cryopump shields 117, may be included in the main vacuum chamber 101 to capture water vapor in the main chamber to assist in forming the vacuum in the main chamber. This reduces the size of the vacuum pumps needed to produce an adequate vacuum and reduces pump down time, and uses no moving parts so that it does not introduce vibrations typically caused by other types of low temperature (<4K) systems. Preferably, the vacuum pump(s) are activated first followed by activation of the cryopump system. Activation of the vacuum pump system prior to the cryopump system may lead to a more efficient vacuum pumping procedure, and to further enhance efficiency, the vacuum pump(s) may be isolated from the main vacuum chamber after a certain period, e.g. the time needed to obtain a pressure value below a certain predetermined threshold value. After isolation of the vacuum pump(s), the cryopump system may continue to operate to complete generation of the vacuum.

Then the intermediate chamber and source chamber are additionally pumped to a desired lower pressure, preferably by means of a chemical getter in a manner known by a skilled person. By using a regenerative, chemical and so-called passive pump like a getter, the pressure level within the intermediate chamber and source chamber can be brought to lower levels than the pressure level in the main chamber without the need of a vacuum turbo pump. The use of a getter avoids the interior or immediate outside vicinity of the vacuum chamber being submitted to acoustical and/or mechanical vibrations as would be the case if a vacuum turbo pump would be used for this a purpose.

The main chamber is initially pumped down by pumping away the air inside the chamber. The pump down continues by catching as many as possible of the molecules left in the chamber using the cryopump shield or similar methods. This results in "catching" molecules circulating in the main chamber and preventing these molecules from entering the intermediate chamber and the source chamber. By using the apertures of one of the aperture arrays to form the opening between the main chamber and the intermediate chamber, thereby reducing the size of the opening, the chance of the (relatively many more) molecules in the main chamber from entering in the intermediate chamber is also reduced. In the same way the opening between source and intermediate chamber limits the chance of the further reduced amount of molecules from entering the source chamber. The use of an aperture array to separate the main chamber and the intermediate chamber permits a higher pressure differential between the chambers and reduces contaminant molecules moving from the main chamber into the intermediate chamber, and onwards to the source chamber.

The main chamber is much larger than the intermediate and source chambers, and contains many components that be a source of outgassing hydrocarbons, water and other contaminant molecules. The most intensive source of outgassing of hydrocarbons is from the resist-coated wafer exposed by the lithography system. These hydrocarbons interact with the charged particles and form EBID (electron beam induced deposition) deposits. The dominant growth of contamination is typically on the apertures, the contamination grown by an EBID process. The current density on the electrodes is much lower than on the apertures.

The intermediate chamber assists by limiting aperture deterioration due to contaminants and EBID growth, especially at the edges of apertures. Although the contamination problem, i.e. EBID growth in the apertures causing reduced aperture diameter, is more severe at the beam stop (which is closer to the source of the hydrocarbon outgassing) than at the aperture arrays, the effect of hydrocarbon partial pressure and EBID growth is also noticeable on the aperture array located further form the wafer, and may necessitate cleaning of the apertures. By having the opening 108 between the intermediate chamber 103 and the main chamber 101 formed by the apertures of one of the aperture array elements, a large pressure differential can be maintained between the source and intermediate chambers and the main chamber. Furthermore, the hydrocarbon partial pressure in the intermediate chamber is reduced very significantly to a very low level, and in the source chamber to an even lower level, as indicated in FIG. 2B. This lower hydrocarbon partial pressure greatly reduces EBID growth on the aperture arrays and other components located in these chambers.

The idea of the present invention is to combine the two aspects into one design, such that each of the two aspects meets a minimum specification, i.e. a maximum pressure. These two aspects are maintaining the required pressure differential between the source chamber and the main chamber, and reducing incidence of contaminants in the intermediate and source chambers, in particular by reducing the hydrocarbon partial pressure in these chambers and reducing EBID growth. With the use of the intermediate chamber, contamination of components in the intermediate and source chambers due to contaminants such as hydrocarbons is expected to drop by a factor of 100 according to preliminary calculations.

Figure 4:
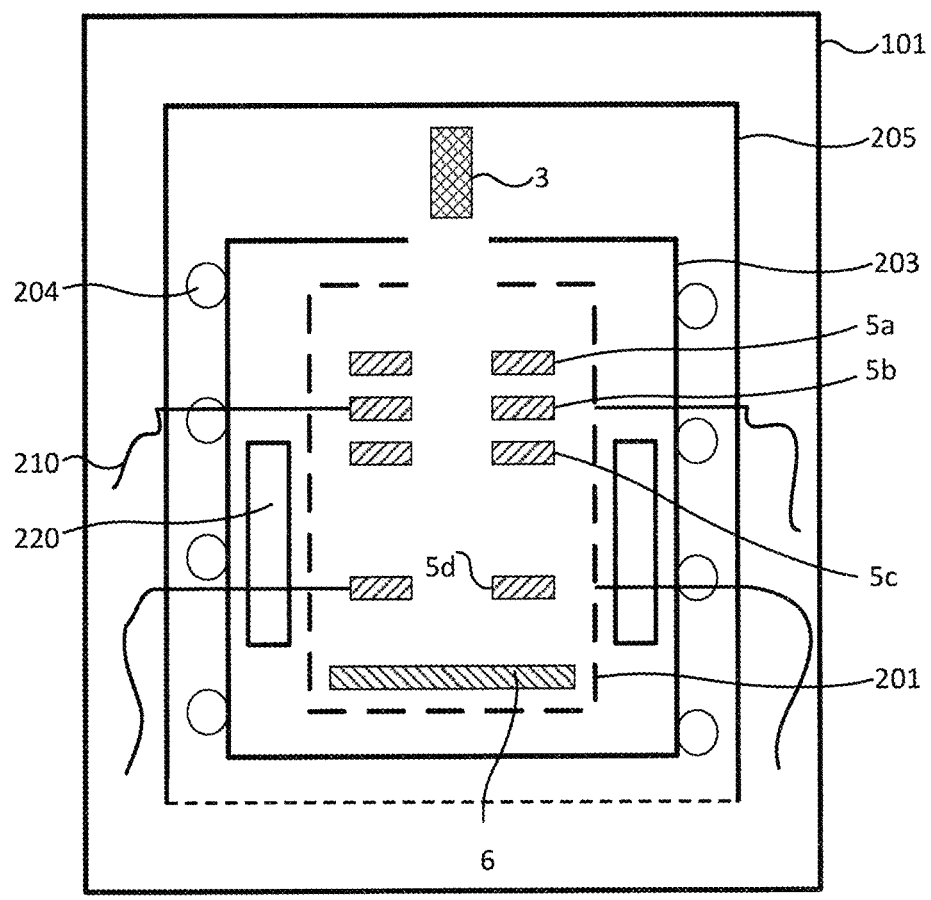
FIG. 4 schematically shows a charged particle beam generator.

FIG. 4 schematically shows a charged particle beam generator. The beam generator comprises a charged particle source 3 for generating a diverging charged particle beam, a collimator system for refracting the charged particle beam, and an aperture array 6. The collimator system comprises an Einzel lens comprising three lenses 5a, 5b, 5c and a further lens 5d. The aperture array 6 is arranged for forming a plurality of charged particle beamlets from the beam generated by the source 3. Additionally, the beam generator comprises one or more openings of a pumping system, such as a pumping system as depicted in FIG. 3 with respect to the intermediate chamber 103. The opening may take the form of an inlet used as an outlet such as outlet 114 depicted in FIG. 3 for connection to a (vacuum) pump 115. The one or more openings may form an integrated part of the pumping system, or the one or more openings may be connectible to one or more pumps within the pumping system. In some embodiments, such as the embodiment depicted in FIG. 4, the one or more openings are part of one or more pumps 220, the pumps 220 being included by the beam generator. The pumps may be getter pumps or sublimation pumps, such as titanium sublimation pumps. Hereafter, embodiments will be discussed in which one or more pumps 220 are included in the beam generator.

One or more lenses within the collimator system, typically lens 5b and 5d, operate at a high voltage, e.g. a voltage that is higher than 500 eV. Electrode 5b, i.e. the center electrode of the Einzel lens arrangement, may be used to refract the charged particle beam. A suitable voltage for this lens may be 15-25 kV, for example about 20 kV. Lenses 5a, 5c may be kept at 0V. Further lens 5d may be used to correct aberrations, as will be discussed later. Lens 5d may operate at a much lower voltage, for example about 1 kV.

The presence of high voltages on non-designated components within the system is undesired, for example because such voltages create additional fields that would influence the charged particle beam in an undesirable, and often unpredictable way. Therefore, the lenses 5a-5d, and in this embodiment also the aperture array 6 are located within a high voltage shielding arrangement 201 for shielding components outside the arrangement 201 from high voltages that are present within the shielding arrangement 201. Furthermore, the charged particle beam that is present during use will be shielded from fields originating from locations outside the high voltage shielding arrangement 201, which may negatively influence the uniformity of the beam and/or may introduce additional aberrations. Preferably, the shielding arrangement 201 comprises a wire mesh structure. The use of a wire mesh structure instead of a closed structure with some small openings therein is that the volume within the shielding arrangement 201 can be more easily pumped down to obtain a suitable vacuum pressure.

The one or more pumps 220 are placed outside the shielding arrangement 201 to avoid that the one or more pumps would be charged. The charged particle beam generates heat, in particular as a result of charged particles back-scattering from the aperture plate 6. As a result, the one or more pumps 220 are heated as well, which could affect their efficiency. The operation of other components may also be negatively influenced by heating. Therefore, the beam generator further comprises a cooling arrangement 203 for removing heat, such as heat generated within the collimator system. The cooling arrangement 203 surrounds the high voltage shielding arrangement 201 and the one or more pumps 220. As a result, the one or more pumps 220 are located between the high voltage shielding arrangement 201 and the cooling arrangement 203. The cooling arrangement 203 may comprise one or more cooling channels 204 through which a cooling liquid, such as water, may flow. The use of active cooling by means of cooling channels with a cooling liquid flow therein enhances heat transfer as compared to a heat sink made of a heat conductive material.

Preferably, a magnetic shield arrangement 205 surrounds the cooling arrangement 203. The use of a magnetic shield arrangement 205 blocks external magnetic fields which could influence the charged particle beam. Preferably, the magnetic shield arrangement 205 comprises one or more walls comprising a magnetic shielding material with a magnetic permeability greater than about 20,000. Preferably, the magnetic shielding material has a magnetic permeability greater than about 300,000. Most preferably, the magnetic shielding material also has a low remanence. Examples of magnetic shielding materials, include, but are not limited to a type of mu-metal and Nanovate™-EM.

The magnetic shield arrangement 205 does not block magnetic fields generated by wiring within the arrangement 205 to interfere with the charged particle beam. Such wiring is for example present to charge the electrodes 5b, 5d. For this reason, the wires within the magnetic shield arrangement 205 are straight and oriented in a radial direction with respect to the center of the collimator system. Furthermore, the wiring may be in such a way that the magnetic fields of different wires cancel each other out as much as possible. Outside the magnetic shield arrangement 205, the orientation of the wires is of less importance, because magnetic fields generated by the wires at these locations may be blocked by the arrangement 205. Note that the magnetic shield arrangement 205 does not necessarily need to be a closed structure. In particular at the bottom, the arrangement 205 may be open, in FIG. 4 denoted by the dashed line.

All components including high voltage shield arrangement 201, cooling arrangement 203 and magnetic field shield arrangement 205 may be placed within a vacuum chamber 101. The use of a separate vacuum chamber for a portion of a lithography apparatus may be useful in a modular design. All components within the vacuum chamber may then for example be aligned with respect to each other and being tested prior to shipment towards a manufacturing environment.

Figure 5:
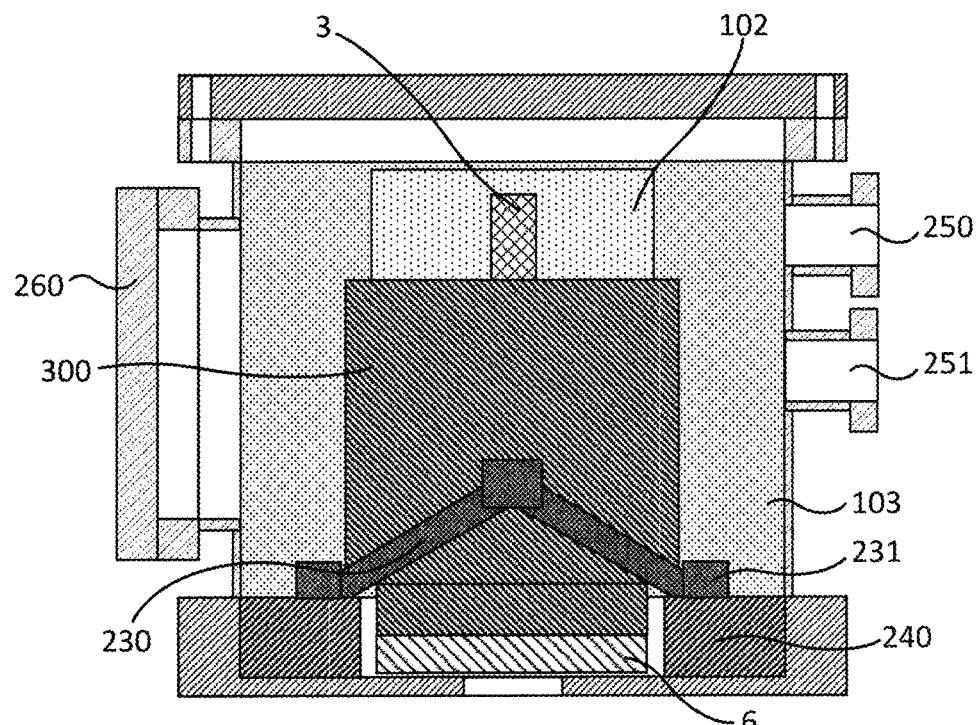
FIG. 5 schematically shows an overview of the beam generator.

FIG. 5 schematically shows an overview of the beam generator. Preferably, the source 3 is located in an area 102 with a higher vacuum than the area 103 in which the collimator resides. In FIGS. 5-8, the collimator is schematically depicted as a block with reference number 300. The collimator is supported by a support structure 230 with feet 231. Preferably, the support structures 230 take the form of so-called A-structures. The support structure 230 may be connected to a frame 240. To establish a vacuum, the beam generator comprises one or more ports 250, 251 for initial pump-down. Reference number 260 refers to a flange that may be arranged for coupling in cooling fluid and/or wiring.

Figure 6:
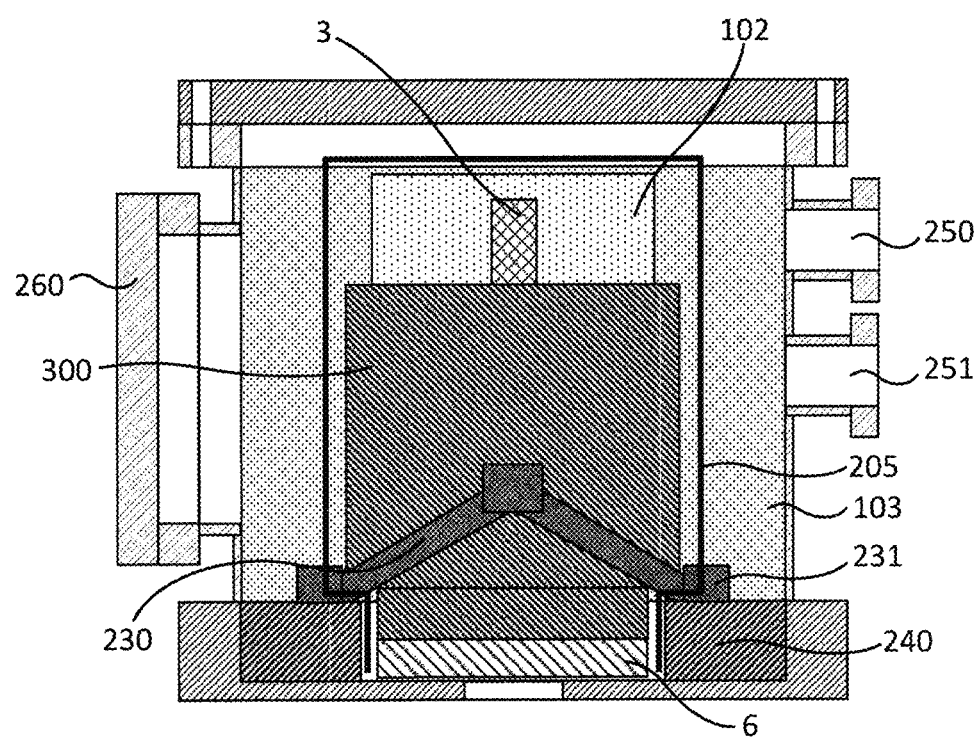
FIG. 6 shows the beam generator of FIG. 5 with a magnetic shielding arrangement provided therein.

FIG. 6 shows the beam generator of FIG. 5 with a magnetic shielding arrangement 205 provided therein. The shielding arrangement 205 may take the form of a cylindrical box around the source 3 and the collimator 300, and may be closed at the top and open at the bottom. As can be seen, the mere use of a shielding arrangement 205 would form a blocking structure for more than just magnetic shielding. For example, wires and cooling fluid tubes may not be able to pass. Furthermore, the shielding arrangement 205 is preferably mounted in such a way that components can be easily replaced and/or maintained.

Figure 7:
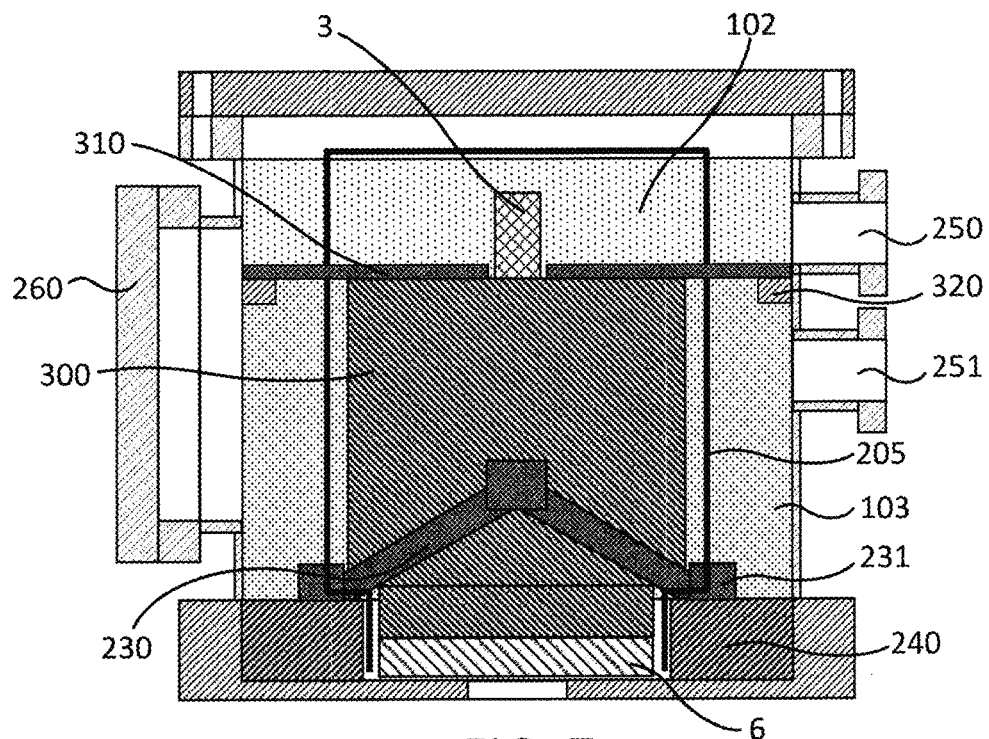
FIG. 7 shows the beam generator of FIG. 6 with vacuum chamber separation.

FIG. 7 shows the beam generator of FIG. 6 with vacuum chamber separation. In particular, a plate 310, preferably a metal plate, creates a first vacuum chamber 102 and a second vacuum chamber 103, where the first vacuum chamber 102 preferably contains a lower pressure than the second vacuum chamber 103. Port 250 may now be used to pump down vacuum chamber 102, whereas port 251 may be used to pump down vacuum chamber 103. The plate is supported by a ring 325.

Figure 8:
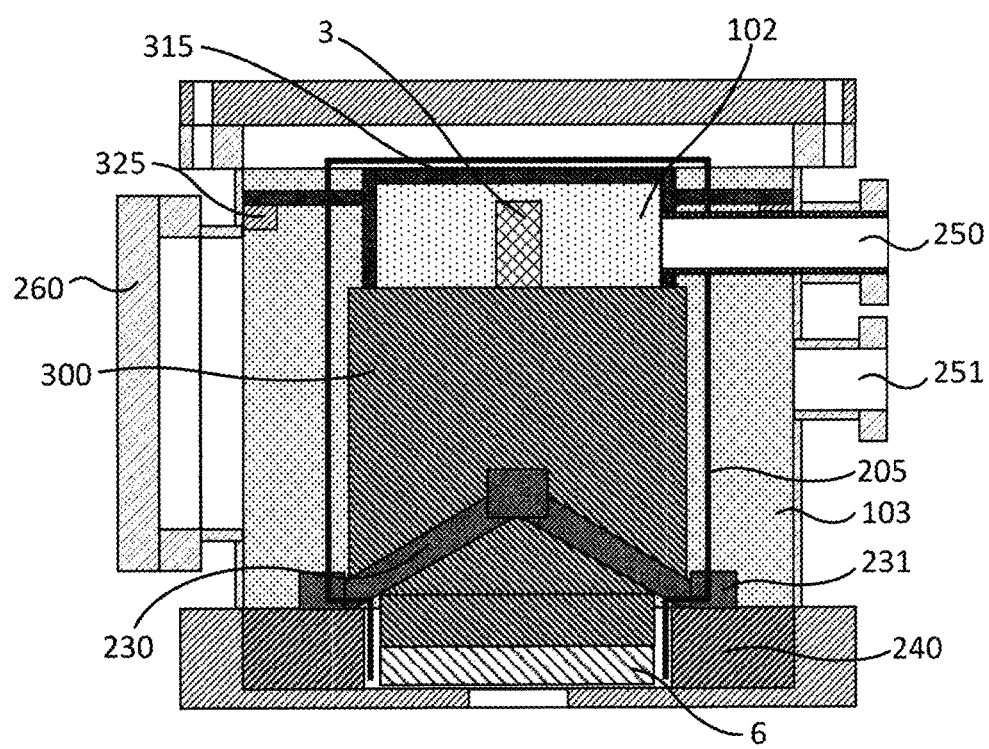
FIG. 8 shows the beam generator of FIG. 6 with another way of vacuum chamber separation.

FIG. 8 shows the beam generator of FIG. 6 with another embodiment of vacuum chamber separation. In this case a structure 315 are mounted around the source 3 to create the first vacuum chamber 102. The structure 315 may also be supported by a ring 325.

Figure 9:
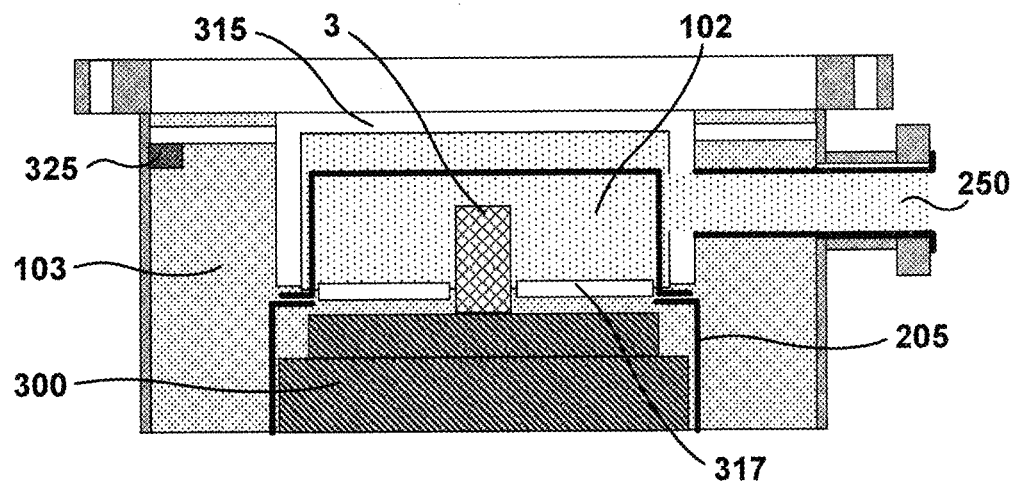
FIG. 9 shows a basic layout of a source chamber and a collimator together with a magnetic shielding arrangement.

In the embodiments of the beam generator shown in FIGS. 7 and 8, the shielding structure of the magnetic shield arrangement 205 is interrupted. FIG. 9 shows a basic layout of the source chamber 102 and the collimator 300 together with the shielding arrangement 205 arranged in such a way that the vacuum leak between the first vacuum chamber 102 and the second vacuum chamber 103 is limited, i.e. its negative influence is acceptable. Note that the structure 315 now comprises a further wall 317 between first vacuum chamber 102 and the second vacuum chamber 103. Furthermore, at locations where the shielding is interrupted, the shielding plates are formed in such a way that they run parallel to each other over a certain distance.

Figure 10:
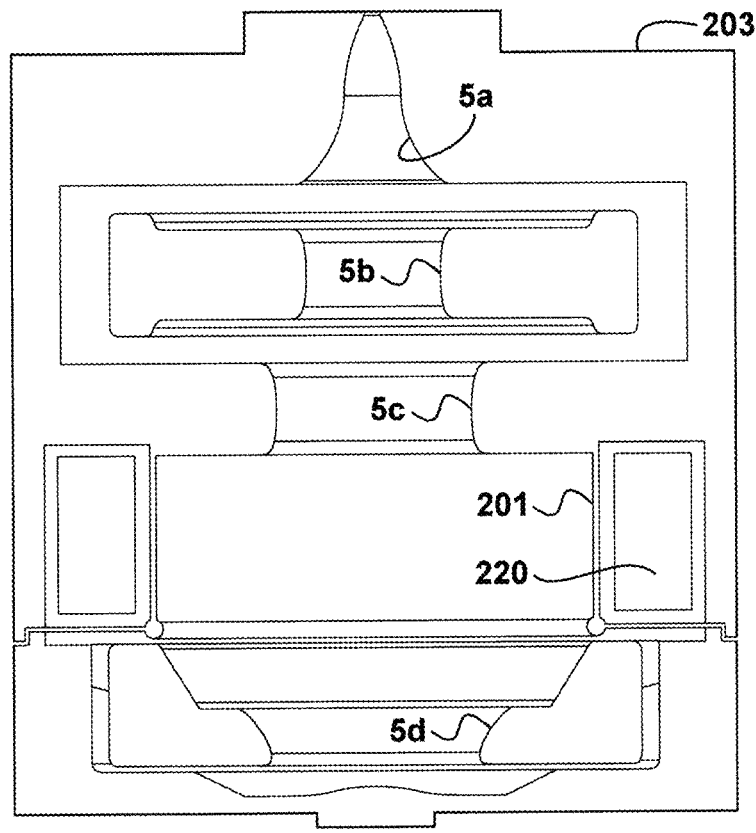
FIG. 10 shows a cross-sectional view of an embodiment of a collimator system.

FIG. 10 shows a cross-sectional view of an embodiment of a collimator system. In the embodiment depicted in FIG. 10, the collimator system comprises a body with a cavity therein, wherein the cavity is structured in such a way that the surface of the cavity serves as the outer electrodes 5a, 5c of the Einzel lens. The center electrode 5b of the Einzel lens may be kept in position within the cavity by means of spacers, for example by means of three or more spring elements as will be discussed with reference to FIGS. 11 and 12. Preferably, the body forms the cooling arrangement 203. In such case, preferably, the body comprises one or more cooling channels (shown in FIG. 11) for accommodating a flow of cooling fluid, e.g. water.

In the embodiment depicted in FIG. 10, the upper electrode 5a is further shaped in such a way that the source 3 that is located upstream is effectively shielded from the electric field generated by the center electrode 5b of the Einzel lens. The center electrode 5b is used to refract the charged particle beam generated by the source. In some embodiments, the central aperture being formed in the upper electrode 5a is therefore substantially conically shaped, or, as depicted in FIG. 10, substantially bell-shaped.

The cross-sectional view further shows the presence of the high-voltage shield 201 and the one or more pumps 220. Finally, in the embodiment depicted in FIG. 10, at a lower position within the cavity, a further electrode 5d is present. This further electrode 5d may be used for aberration correction. The shown shape of this electrode 5d may further provide a repulsive force for low energy electrons that backscatter from the aperture array. Consequently, less electrons re-enter the cavity, which reduces EBID. Similar to the center electrode 5b of the Einzel lens, the further electrode 5d is connected to the cavity by means of spacers, for example by means three or more spring elements, as will be discussed with reference to FIGS. 11 and 12.

Figure 11:
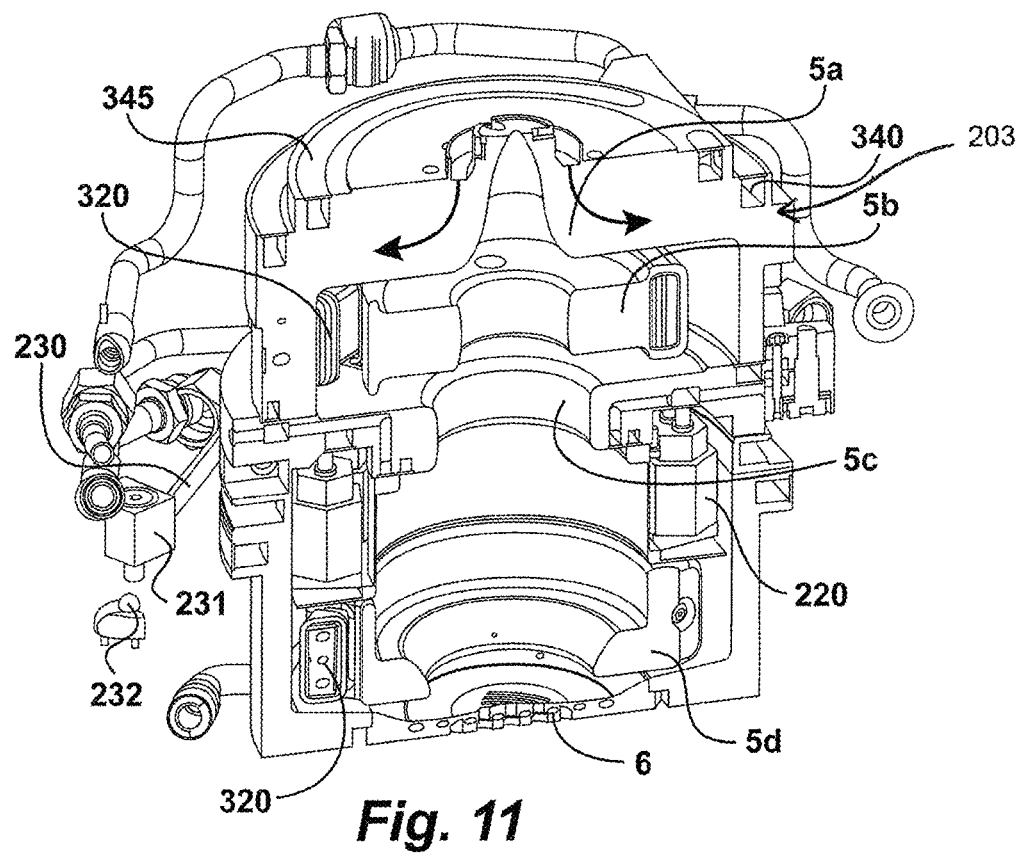
FIG. 11 shows an elevated cross-sectional view of the collimator of FIG. 10.

FIG. 11 shows an elevated cross-sectional view of the collimator system of FIG. 10. The cooling arrangement 203 comprises one or more cooling channels 340 for accommodating a flow of cooling liquid. In the embodiment of FIG. 11, the cooling channels are grooves provided with a cover 345 using laser drilling and laser welding. Alternatively, cooling channels may be manufactured by one or more other techniques known in the art such as brazing. The cooling channels preferably also cool in a vertical direction, as denoted by the arrows.

FIG. 11 further shows that the support structure 230 for supporting the collimator may be provided with feet 231 that match with balls 232 that are located at predetermined positions. The use of such balls 232 enables alignment of different modules in a lithography system with respect to each other.

Figure 12:
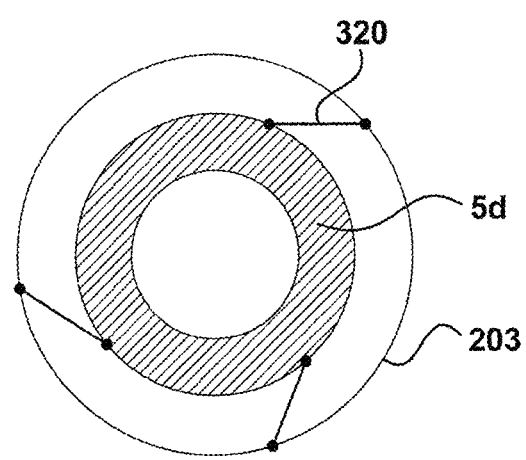
FIG. 12 shows a cross-sectional top view of a possible connection between spring elements and a cavity within a cooling arrangement.

Furthermore, FIG. 11 shows spring elements 320 for connecting the center electrode 5b of the Einzel lens and the further electrode 5d with the surface of the cavity. A cross-sectional view of such arrangement showing a possible orientation of the spring elements 320 is schematically depicted in FIG. 12.

Figure 13:
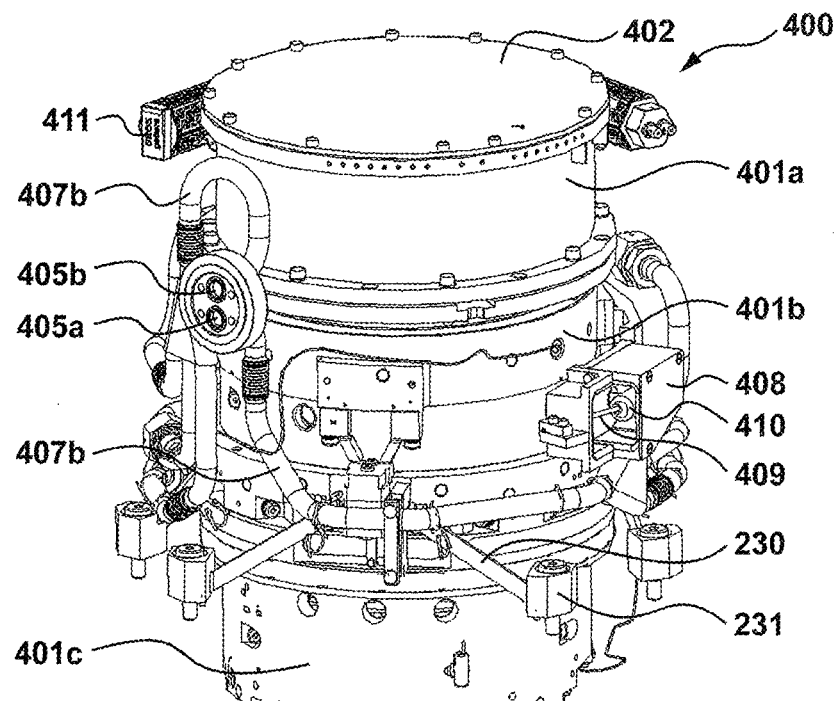
FIG. 13 shows an elevated side view of a beam generator according to an embodiment of the invention.

FIG. 13 shows an elevated side view of a beam generator 400 according to an embodiment of the invention. The beam generator comprises a housing, which in this embodiment comprises three parts 401a, 401b and 401c connected to each other by means of flanges 402. Housing part 401a accommodates a source 3, housing part 401b accommodates an Einzel lens having three electrodes 5a, 5b and 5c, and housing part 401c accommodates a further electrode 5d for aberration corrections.

At the outside of the housing connections are available for accommodating supply and removal of cooling fluid to be used by a cooling arrangement. A suitable cooling fluid is water. A supply unit, such as a supply tube, for supply of cooling fluid may be connected to an inlet 405a of a fluid supply conduit 407a. Similarly, a fluid removal unit, such as a tube, for removal of cooling fluid, may be connected to an outlet 405b of a fluid removal conduit 407b.

The housing further accommodates support of a high voltage supply unit 408. The high voltage supply unit 408 contains a wire 409 via which a high voltage is applied to the middle electrode 5b of the Einzel lens. Additionally, a high voltage may be applied to the further electrode 5d. The wire is suitable insulated by means of a insulating structure 410 to avoid discharges.

The beam generator 400 is placed in a vacuum chamber. The pressure in the vacuum chamber may be reduced by means of pumps 411 that are connected to the housing of the beam generator 400.

As already discussed with reference to FIG. 11 support structures 230 and feet 231 may be used to support the beam generator 400.

Figure 14:
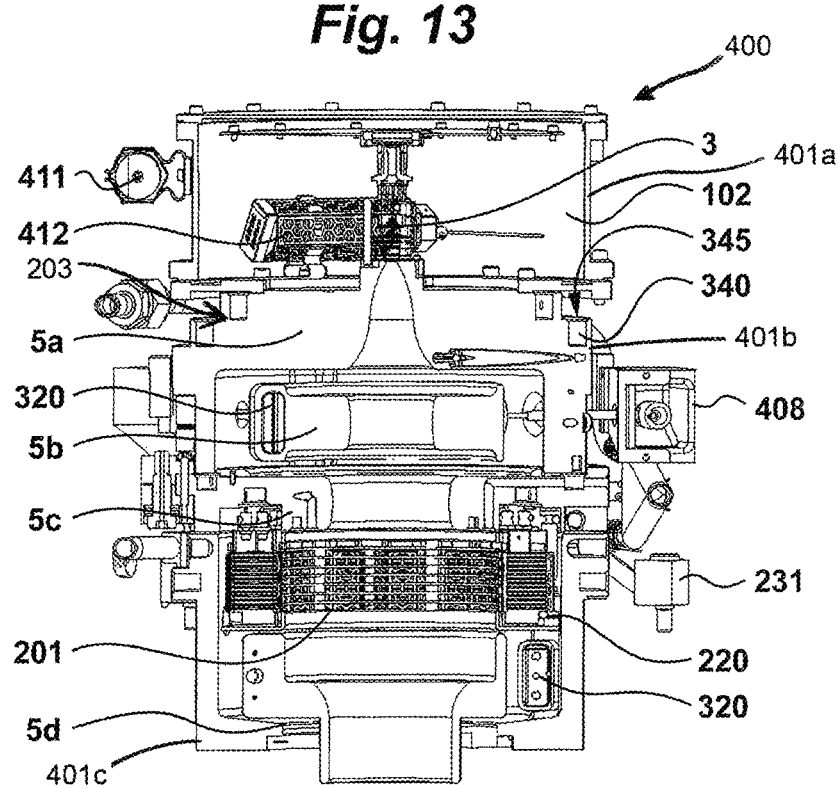
FIG. 14 shows a first cross-sectional side view of the beam generator of FIG. 13.

FIG. 14 shows a first cross-sectional side view of the beam generator of FIG. 13. The source 3 is placed in a separate source chamber 102. The pressure in the source chamber 102 may be regulated by means of one or more pumps 412. The shape and size of the Einzel lens electrodes 5a, 5b and 5c is similar to the electrodes shown in and described with reference to FIG. 11. The beam generator comprises multiple pumps 220 that are arranged in circumference of the cavity through which the beam passes during use behind a high voltage shielding arrangement 201. The high voltage shielding arrangement 201 in this embodiment comprises a wire mesh structure. The use of a wire mesh structure provides sufficient shielding from high voltages, while simultaneously allowing the pumps 220 to have sufficient access to the space within the high voltage shielding arrangement 201 to create a suitable vacuum pressure.

The pumps 220 effectively regulate the pressure within a chamber formed within the housing parts 401b and 401c, which may be qualified as an intermediate chamber as discussed with reference to FIGS. 2a, 2b and 3. The difference compared to the intermediate chamber 103 of FIG. 3 is that the aperture array 6 is not placed within the intermediate chamber formed by the interior of housing parts 401b and 401c.

Figure 15:
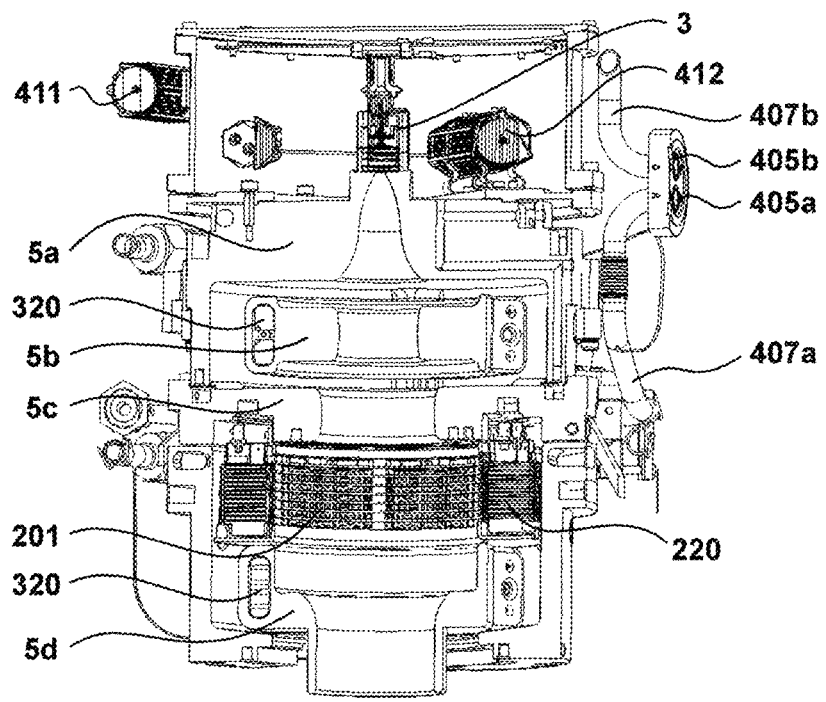
FIG. 15 shows a second cross-sectional side view of the beam generator of FIG. 13.

FIG. 15 shows a second cross-sectional side view of the beam generator of FIG. 13. In this cross-sectional view, portions of the cooling arrangement of the beam generator are depicted. In particular, FIG. 15 shows inlet 405a and a portion of a fluid supply conduit 407a for accommodating a supply of cooling fluid, as well as outlet 405b and a portion of a fluid removal conduit 407b for removal of cooling fluid after it has absorbed heat in the beam generator.

Heat is not only generated by the presence of a high field within the Einzel lens. In particular in cases where the aperture array 6 is placed in close proximity of the Einzel lens, for example directly below or above the further electrode 5d, backscattered charged particles will cause heat generation within the system. Such heat generation will not only be limited to the lower electrode 5c of the Einzel lens, but may also seriously affect the upper electrode 5a of the Einzel lens. An embodiment of an arrangement of channels for cooling a portion of the collimator system in the beam generator will be described with reference to FIG. 17.

Figure 16:
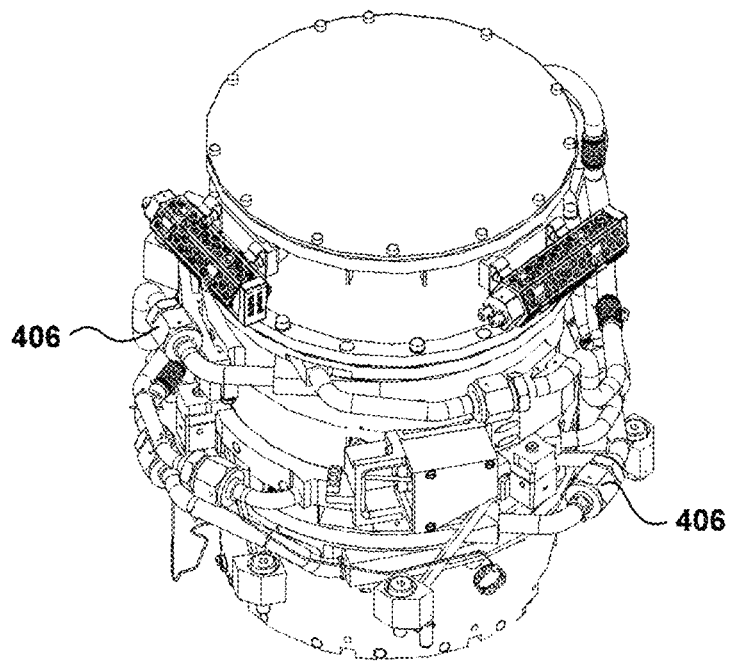
FIG. 16 shows another elevated side view of the beam generator of FIG. 13.

FIG. 16 shows another elevated side view of the beam generator of FIG. 13. In this view, tube splitters 406 are shown, which divide the streams of cooling fluid to different portions of the cooling arrangement. In some embodiments, the cooling arrangement is divided in three segments. An upper segment of the cooling arrangement may then be arranged for cooling the upper electrode 5a of the Einzel lens. A middle segment of the cooling arrangement may then be arranged for cooling the lower electrode 5c of the Einzel lens. Finally, a lower segment of the cooling arrangement may be used for cooling the further electrode 5d. It will be understood that in embodiments where a further electrode 5d is absent, fewer segments may be used.

In the presently shown embodiment, the middle electrode 5b of the Einzel lens is not actively cooled by means of a cooling fluid.

Figure 17:
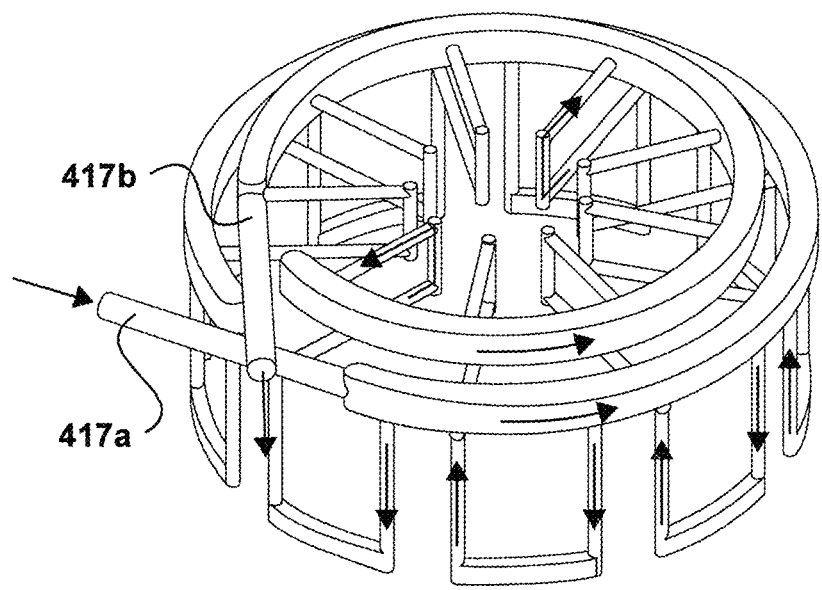
FIG. 17 shows an elevated side view of an arrangement of channels used to cool a portion of the collimator system in the beam generator of FIG. 13.

FIG. 17 shows an elevated side view of an arrangement of channels used to cool a portion of the collimator system in the beam generator of FIG. 13. This channel arrangement is particularly suitable for use as the upper segment in a cooling arrangement having three segments as discussed earlier. Although FIG. 17 appears to depict tubes, the infrastructure for cooling is preferably formed by channels fainted within a solid structure with a suitable heat conduction.

Cooling fluid, such as water, is supplied via channel 417a. The cooling fluid progresses in a substantially horizontal direction in circumference of the cavity formed within the body of the collimator lens. Along the circumference, side channels arrange for transfer of a portion of the cooling fluid supplied via channel 417a subsequently in downwards in a substantially vertical direction, substantially horizontal in a direction substantially opposite to the flow direction in the channel 417a, upwards in a substantially vertical direction, radially inwards in a substantially horizontal direction, upwards in a substantially vertical direction, and radially outwards in a substantially horizontal direction. Finally, the side channels terminate in a channel 417b which progresses along the circumference of the cavity formed within the body of the collimator lens and flows out of the arrangement. The shown channel arrangement is suitable for absorbing a great amount of heat. The extent of heat absorption along the vertical direction, in particular with respect to the upper electrode 5a of the Einzel lens, may largely determine the optimal thickness of the upper electrode 5a of the Einzel lens.

Figure 18:
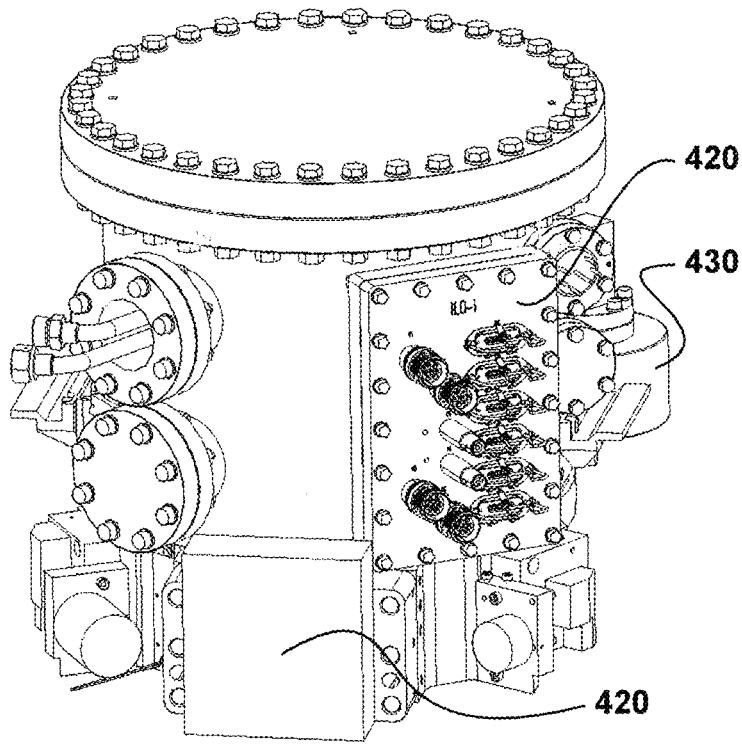
FIG. 18 shows yet another elevated side view of the beam generator of FIG. 13.

FIG. 18 shows yet another elevated side view of the beam generator of FIG. 13. In this view, a patch panel 420 is shown for arranging a connection of wiring. Additionally, this view shows the presence of contra weights 430. The contra weights 430 may be used to adapt the center of mass of the beam generator so as to allow a stable structure with more predictable characteristics.

In some embodiments, such as the embodiment discussed with reference to FIGS. 13-18, a cavity within the collimator lens forms an chamber with a mostly closed nature, i.e. the housing surrounding the collimator lens has limited openings. As a result, one or more pump outlets, in some embodiments part of pumps 220, may create a relatively low vacuum pressure within the cavity, e.g. a pressure in the order of $10^{-6}$ bar, but lower pressures up to $10^{-10}$ bar are achievable. A low pressure within the collimator lens reduces ionization of residual molecules which could not only negatively affect the charged particle beam, but also may lead to actual impingement of ions onto the source 3. Such impingement could seriously limit the lifetime of the source 3, and is therefore undesirable.

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

The invention claimed is:

1. A charged particle beam generator comprising:
a charged particle source for generating a charged particle beam;
a collimator system comprising electrodes for collimating the charged particle beam;
a high voltage shielding arrangement for shielding components outside the high voltage shielding arrangement from high voltages within the high voltage shielding arrangement; and
at least one vacuum pump for regulating a pressure of a space within the high voltage shielding arrangement,
wherein the at least one vacuum pump is a component outside the high voltage shielding arrangement.

2. The generator according to claim 1, wherein the at least one vacuum pump is located directly next to the high voltage shielding arrangement.

3. The generator according to claim 1, wherein the at least one vacuum pump is a getter pump or a sublimation pump.

4. The generator according to claim 1, wherein at least a part of the collimator system is located within the high voltage shielding arrangement.

5. The generator according to claim 1, wherein at least one of the electrodes is located within the high voltage shielding arrangement.

6. The generator according to claim 1, wherein the collimator system comprises a further electrode for aberration correction and/or for providing a repulsive force to backscatter particles, wherein the collimator system comprises an area in between the further electrode and an adjacent electrode of the collimator system in upstream direction of the charged particle beam, wherein the high voltage shielding arrangement is located around the area, and wherein the at least one vacuum pump is located next to the area and directly next to the high voltage shielding arrangement.

7. The generator according to claim 1, wherein the collimator system comprises an Einzel lens comprising three electrodes.

8. The generator according to claim 1, wherein the collimator system comprises a body with a cavity therein, and wherein the beam generator comprises multiple vacuum pumps that are arranged behind the high voltage shielding arrangement in circumference of the cavity through which the charged particle beams passes during use.

9. The generator according to claim 1, wherein the high voltage shielding arrangement comprises a wire mesh structure.

10. The generator according to claim 1, further comprising an aperture array for forming a plurality of beamlets from the charged particle beam.

11. A charged particle lithography system for exposing a target, the system comprising:
a charged particle beam generator for generating a charged particle beam;
an aperture array for forming a plurality of beamlets from the charged particle beam; and
a beamlet projector for projecting the beamlets onto a surface of the target,
wherein the charged particle beam generator comprises:
a charged particle source for generating the charged particle beam;
a collimator system comprising electrodes for collimating the charged particle beam;
a high voltage shielding arrangement for shielding components outside the high voltage shielding arrangement from high voltages within the high voltage shielding arrangement; and
at least one vacuum pump for regulating a pressure of a space within the high voltage shielding arrangement,
wherein the at least one vacuum pump is a component outside the high voltage shielding arrangement.

12. The system according to claim 11, wherein the at least one vacuum pump is located directly next to the high voltage shielding arrangement.

13. The system according to claim 11, wherein the at least one vacuum pump is a getter pump or a sublimation pump.

14. The system according to claim 11, wherein at least a part of the collimator system is located within the high voltage shielding arrangement.

15. The system according to claim 11, wherein at least one of the electrodes is located within the high voltage shielding arrangement.

16. The system according to claim 11, wherein the collimator system comprises a further electrode for aberration correction and/or for providing a repulsive force to backscatter particles, wherein the collimator system comprises an area in between the further electrode and an adjacent electrode of the collimator system in upstream direction of the charged particle beam, wherein the high voltage shielding arrangement is located around the area, and wherein the at least one vacuum pump is located next to the area and directly next to the high voltage shielding arrangement.

17. The system according to claim 11, wherein the collimator system comprises an Einzel lens comprising three electrodes.

18. The system according to claim 11, wherein the collimator system comprises a body with a cavity therein, and wherein the beam generator comprises multiple vacuum pumps that are arranged behind the high voltage shielding arrangement in circumference of the cavity through which the charged particle beams passes during use.

19. The system according to claim 11, wherein the high voltage shielding arrangement comprises a wire mesh structure.

20. A cooling arrangement of a collimator system of a charged particle beam generator, wherein the collimator system comprises electrodes for collimating a charged particle beam generated by the charged particle beam generator, the cooling arrangement comprising one or more cooling channels for accommodating a flow of cooling fluid, wherein the one or more cooling channels are arranged inside at least one of the electrodes of the collimator system.

21. The arrangement according to claim 20, wherein collimator system is arranged to operate at high voltages above 500 eV.

22. The arrangement according to claim 20, wherein the charged particle beam generator comprises a housing, wherein the collimator system is accommodated inside the housing, and wherein the cooling arrangement further comprises connections on the outside of the housing for supply and removal of the cooling fluid to the one or more cooling channels.

23. The arrangement according to claim 22, wherein the connections include an inlet of a fluid supply conduit and an outlet of a fluid removal conduit on the outside of the housing, the fluid supply conduit and the fluid removal conduit being in flow connection with the one or more cooling channels.

24. The arrangement according to claim 22, further comprising one or more tube splitters on the outside of the housing for dividing streams of cooling fluid to different portions of the cooling arrangement.

25. The arrangement according to claim 24, wherein the collimator system comprises an Einzel lens comprising an upper electrode, a middle electrode and a lower electrode, relative to the direction of the charged particle beam, and wherein the different portions of the cooling arrangement include one or more of: an upper segment for cooling the upper electrode and a middle segment for cooling the lower electrode.

26. The generator according to claim 20, wherein the collimator system comprises a further electrode for aberration correction and/or for providing a repulsive force to backscatter particles, the further electrode being situated below the electrodes for collimating the charged particle beam, relative to the direction of the charged particle beam, and wherein a cooling channel is arranged inside the further electrode of the collimator system.

27. The arrangement according to claim 24, wherein the collimator system comprises an Einzel lens comprising an upper electrode, a middle electrode and a lower electrode, relative to the direction of the charged particle beam, wherein the collimator system further comprises a further electrode for aberration correction and/or for providing a repulsive force to backscatter particles, the further electrode being situated below the Einzel lens, and wherein the different portions of the cooling arrangement include one or more of: an upper segment for cooling the upper electrode, a middle segment for cooling the lower electrode and a lower segment for cooling the further electrode.

28. The arrangement according to claim 20, wherein the collimator system comprises an Einzel lens comprising an upper electrode, a middle electrode and a lower electrode, relative to the direction of the charged particle beam, wherein a cooling channel is arranged inside the upper electrode, wherein no cooling channel is arranged inside the middle electrode, and wherein no cooling channel is arranged inside the lower electrode.

29. The arrangement according to claim 20, wherein the collimator system comprises an Einzel lens comprising an upper electrode, a middle electrode and a lower electrode, relative to the direction of the charged particle beam, wherein the one or more cooling channels are arranged inside the upper electrode and inside the lower electrode, and wherein no cooling channel is arranged inside the middle electrode.

30. The arrangement according to claim 20, wherein the one or more cooling channels are formed inside the at least one of the electrodes as grooves.

31. The arrangement according to claim 30, wherein the grooves are created in the at least one of the electrodes using laser drilling and laser welding, or using brazing.

32. The arrangement according to claim 30, wherein the grooves are provided with a cover.

33. The arrangement according to claim 20, wherein the one or more cooling channels are formed by tubes.

34. The arrangement according to claim 20, wherein the one or more cooling channels are arranged inside the at least one of the electrodes such that the cooling fluid progresses in a substantially horizontal direction in a plane perpendicular to the direction of the charged particle beam in a circumference of the electrode.

35. The arrangement according to claim 33, wherein along the circumference of the electrode a supply channel, a removal channel and a plurality of side channels are arranged, wherein the cooling arrangement is arranged to supply portions of the cooling fluid from the supply channel to the removal channel via each of the plurality of side channels, wherein each side channel comprises:
    a first part arranged for progressing the cooling fluid in a substantially first vertical direction parallel to and in a direction of the charged particle beam; followed by
    a second part arranged for progressing the cooling fluid in a substantially horizontal direction perpendicular to the first vertical direction and in a direction substantially opposite to the flow direction in the supply channel; followed by
    a third part arranged for progressing the cooling fluid in a substantially second vertical direction opposite of the first vertical direction; followed by
    a fourth part arranged for progressing the cooling fluid in a direction radially inwards and perpendicular to the second vertical direction; followed by
    a fifth part arranged for progressing the cooling fluid in the substantially second vertical direction; followed by
    a sixth part arranged for progressing the cooling fluid in a direction radially outwards an perpendicular to the second vertical direction.

36. A charged particle beam generator comprising
    a charged particle source for generating a charged particle beam; and
    a collimator system comprising electrodes for collimating the charged particle beam,
wherein the collimator system comprises a cooling arrangement according to claim 20.

37. A charged particle lithography system for exposing a target, the system comprising:
    a charged particle beam generator for generating a charged particle beam;
    an aperture array for forming a plurality of beamlets from the charged particle beam; and
    a beamlet projector for projecting the beamlets onto a surface of the target, wherein the charged particle beam generator comprises:
- a charged particle source for generating the charged particle beam; and
- a collimator system comprising electrodes for collimating the charged particle beam, wherein the collimator system comprises a cooling arrangement according to claim 20.

\* \* \* \* \*